(12) United States Patent
Sakaguchi et al.

(10) Patent No.: US 7,054,141 B2
(45) Date of Patent: May 30, 2006

(54) CAPACITOR, CAPACITOR-EMBEDDED BOARD, AND METHOD FOR MANUFACTURING THE CAPACITOR

(75) Inventors: Hideaki Sakaguchi, Nagano (JP); Takashi Kurihara, Nagano (JP); Mitsutoshi Higashi, Nagano (JP); Takashi Mochizuki, Minamiazumi-gun (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/155,351

(22) Filed: Jun. 17, 2005

(65) Prior Publication Data

US 2005/0280978 A1    Dec. 22, 2005

(30) Foreign Application Priority Data

Jun. 18, 2004  (JP)  ............................. 2004-181339

(51) Int. Cl.
*H01G 9/00* (2006.01)
(52) U.S. Cl. ...................... 361/523; 361/525; 361/503; 361/512; 29/25.03
(58) Field of Classification Search ................ 361/523, 361/525–526, 540, 502–504, 512, 524; 29/25.03
See application file for complete search history.

(56) References Cited

U.S. PATENT DOCUMENTS

| 5,140,502 | A | * | 8/1992 | Kudoh et al. | ............... | 361/540 |
| 5,237,031 | A | * | 8/1993 | Kubota et al. | ............... | 526/305 |
| 6,094,338 | A | * | 7/2000 | Hirahara et al. | ............ | 361/502 |
| 2005/0152097 | A1 | * | 7/2005 | Sakaguchi et al. | .......... | 361/523 |

FOREIGN PATENT DOCUMENTS

JP       64-32621       2/1989

* cited by examiner

*Primary Examiner*—Anthony Dinkins
(74) *Attorney, Agent, or Firm*—Rankin, Hill, Porter & Clark LLP

(57) ABSTRACT

A capacitor includes a dielectric layer, a manganese dioxide layer, an organic solid electrolyte layer, and a carbon paste layer that are stacked in this order between a first electrode, which serves as an anode, and a second electrode, which serves as a cathode. Between the first electrode and the second electrode, an insulating resin layer is formed in the shape of a rectangular frame so as to surround the organic solid electrolyte layer. A lower end portion of the resin layer is fixed to the manganese dioxide layer while an upper end portion of the resin layer is fixed to the second electrode 16. Therefore, complete sealing is established between the first electrode and the second electrode in the outer peripheral end face of the capacitor.

13 Claims, 13 Drawing Sheets

CAPACITOR, CAPACITOR-EMBEDDED BOARD, AND METHOD FOR MANUFACTURING THE CAPACITOR

This application claims foreign priority based on Japanese Patent application No. 2004-181339, filed Jun. 18, 2004, the contents of which is incorporated herein by reference in its entirety.

BACKGROUND OF THE INVENTION

1. Field of the Invention

The present invention relates to a capacitor using a solid electrolyte, a capacitor-embedded board, and a method for manufacturing the capacitor.

2. Description of the Related Art

A capacitor using a solid electrolyte has a structure in which at least a first electrode, a dielectric layer, an organic solid electrolyte, and a second electrode are stacked in this order. Such a capacitor is generally manufactured in the following manner. On the surface of an anode serving as the first electrode, a dielectric layer is formed with an anodic oxidation method, or the like. Then, an organic solid electrolyte layer is formed. Thereafter, on the surface of the organic solid electrolyte layer, a carbon paste, a silver paste, or the like is coated, thereby to form a cathode as the second electrode such as disclosed in JP-64-32621.

Herein, when an electrolytically polymerized film of polypyrrole is used as the solid electrolyte layer, a thin manganese dioxide film or a thin chemically polymerized polypyrrole layer is formed on the surface of the dielectric layer. Thus, conductivity is imparted to the surface of the dielectric layer, followed by electrolytic polymerization.

However, a conventional capacitor has the following problem. An organic solid electrolyte layer is stacked on the surface of an inorganic layer such as a dielectric layer or a manganese dioxide layer. For this reason, when a temperature change occurs, a stress caused by the difference between the thermal expansion coefficient of the organic solid electrolyte layer and the thermal expansion coefficient of the inorganic layer occurs. As a result, the organic solid electrolyte layer peels off therefrom.

SUMMARY OF THE INVENTION

In view of the foregoing problem, the objects of the present invention relates to a capacitor capable of preventing the organic solid electrolyte layer from peeling off with reliability, a capacitor-embedded board, and a method for manufacturing the capacitor.

In order to solve the foregoing problem, the invention provides a capacitor which includes a first electrode and a second electrode, and at least a dielectric layer and an organic solid electrolyte layer stacked in this order between the first electrode and the second electrode, the capacitor including a resin layer formed in such a manner as to surround the organic solid electrolyte layer between the first electrode and the second electrode, wherein the upper end portion and the lower end portion of the resin layer are fixed to layers other than the organic solid electrolyte layer on the first electrode side and the second electrode side, respectively.

In the invention, for forming the dielectric layer, for example, the first electrode is formed of a valve metal, and anodic oxidation is carried out thereon. Herein, the term "valve metal" denotes a metal capable of forming a dielectric material by anodic oxidation, such as aluminum, tantalum, niobium, tungsten, vanadium, bismuth, titanium, zirconium, hafnium, or an alloy thereof or a compound thereof.

In the invention, for the resin layer formed in such a manner as to surround the organic solid electrolyte layer, the upper end portion and the lower end portion thereof are fixed to layers other than the organic solid electrolyte layer on the first electrode side and the second electrode side, respectively. For this reason, both of the bottom side interface and the top side interface of the organic solid electrolyte layer are surrounded and covered with the resin layer, so that the organic solid electrolyte layer is not exposed at all. Further, the organic solid electrolyte layer is completely sandwiched from above and below, and the space is completely defined by the resin layer. Therefore, even when the thermal expansion coefficient of the organic solid electrolyte layer and the thermal expansion coefficient of the layer in contact with the organic solid electrolyte layer are different from each other, peeling caused by a temperature change does not occur. Whereas, the resin layer is not the one for covering the whole as merely an outer coating resin, but it is formed between the first electrode and the second electrode. For this reason, even if the resin layer is formed, the outer dimensions of the capacitor do not increase, which does not prevent the decrease in size of the capacitor.

In the invention, it is preferable that the resin layer is formed on an upper layer side of the dielectric layer. Namely, it is possible to form the dielectric layer on the first electrode prior to the formation of the resin layer. For this reason, when the dielectric layer is formed, it is not necessary to consider the stability of the resin layer to the chemical to be used, or the heat treatment.

In the invention, the resin layer includes, for example, a lower layer side resin layer on the first electrode side and an upper layer side resin layer stacked on the lower layer side resin layer, and both the lower layer side resin layer and the upper layer side resin layer are composed of an insulating resin.

In the invention, such a configuration is also acceptable in which the resin layer includes, for example, a lower layer side resin layer on the first electrode side and an upper layer side resin layer stacked on the lower layer side resin layer, and the lower layer side resin layer is composed of an insulating resin, and the upper layer side resin layer is composed of a conductive resin.

In the invention, it is preferable that the upper layer side resin layer is formed with a larger width than that of the lower layer side resin layer, and partially covers the top surface of the solid electrolyte layer. With such a configuration, it is possible to prevent the solid electrolyte layer from peeling at the top surface side interface with more reliability.

In order to form a capacitor-embedded board by the use of the capacitor in accordance with the invention, it is only essential that the first electrode is formed on an insulating substrate for forming a board for capacitor incorporation. Herein, the first electrode may be either formed in such a manner as to be stacked directly on the insulating substrate, or may be formed in such a manner as to be stacked on the insulating substrate via another conductive layer.

In the invention, a method for manufacturing a capacitor in which at least a dielectric layer, an organic solid electrolyte, and a second electrode are stacked in this order on a first electrode, includes at least: a resin layer formation step of forming a resin layer in such a manner as to surround an organic solid electrolyte layer formation area on the first electrode side prior to the formation of the organic solid electrolyte layer; an organic solid electrolyte layer formation step of forming the organic solid electrolyte layer in an area surrounded by the resin layer; and a second electrode formation step of forming the second electrode on the upper layer side of the organic solid electrolyte layer.

In the invention, preferably, a large sized first electrode capable of manufacturing a plurality of capacitors is prepared as the first electrode, in the resin layer formation step, the resin layer is formed in such a manner as to surround a plurality of the organic solid electrolyte layer formation areas on the large sized first electrode side, in the organic solid electrolyte layer formation step, the organic solid electrolyte layer is formed in a plurality of areas surrounded by the resin layer, and after performing the organic solid electrolyte layer formation step, the large sized first electrode is cut together with the resin layer along the resin layer. When the cutting is made along the portion corresponding to the resin layer in this manner, it is possible to prevent the first electrode side and the second electrode side from short-circuiting at the cut end face with reliability.

In the present invention, for the resin layer formed in such a manner as to surround the organic solid electrolyte layer, the upper end portion and the lower end portion thereof are fixed to layers other than the organic solid electrolyte layer on the first electrode side and the second electrode side, respectively. For this reason, both of the bottom side interface and the top side interface of the organic solid electrolyte layer are surrounded and covered with the resin layer, so that the organic solid electrolyte layer is not exposed at all. Further, the organic solid electrolyte layer is completely sandwiched from above and below, and the space is completely defined by the resin layer. Therefore, the organic solid electrolyte layer will not peel off by a temperature change or the like. Whereas, the resin layer is formed between the first electrode and the second electrode. For this reason, even if the resin layer is formed, the outer dimensions of the capacitor do not increase, which does not prevent the decrease in size of the capacitor. As a result, it is possible to provide a small sized and high reliability capacitor.

DESCRIPTION OF THE PREFERRED EMBODIMENTS

Embodiments of the present invention will be described hereinbelow by reference to the drawings. Unless otherwise specifically defined in the specification, terms have their ordinary meaning as would be understood by those of ordinary skill in the art.

Embodiment 1

(Structure of Capacitor)

Figure 1:
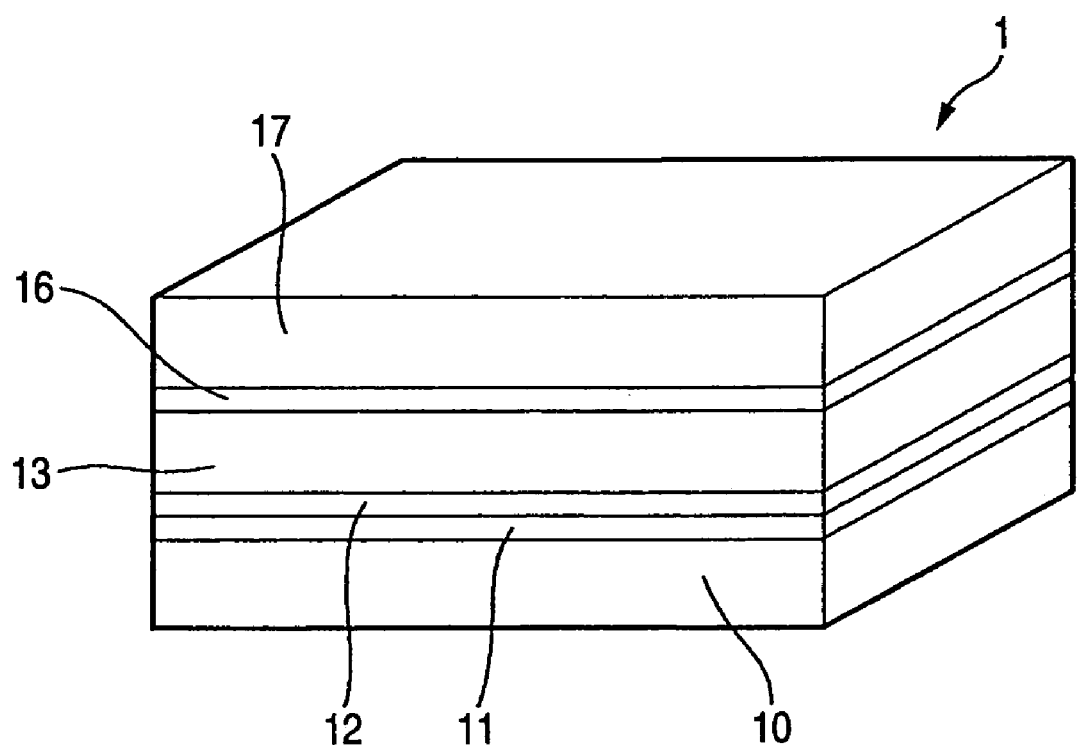
FIG. 1 is an explanatory view showing the outward appearance of a polar capacitor in accordance with Embodiment 1 of the present invention.
Figure 2:
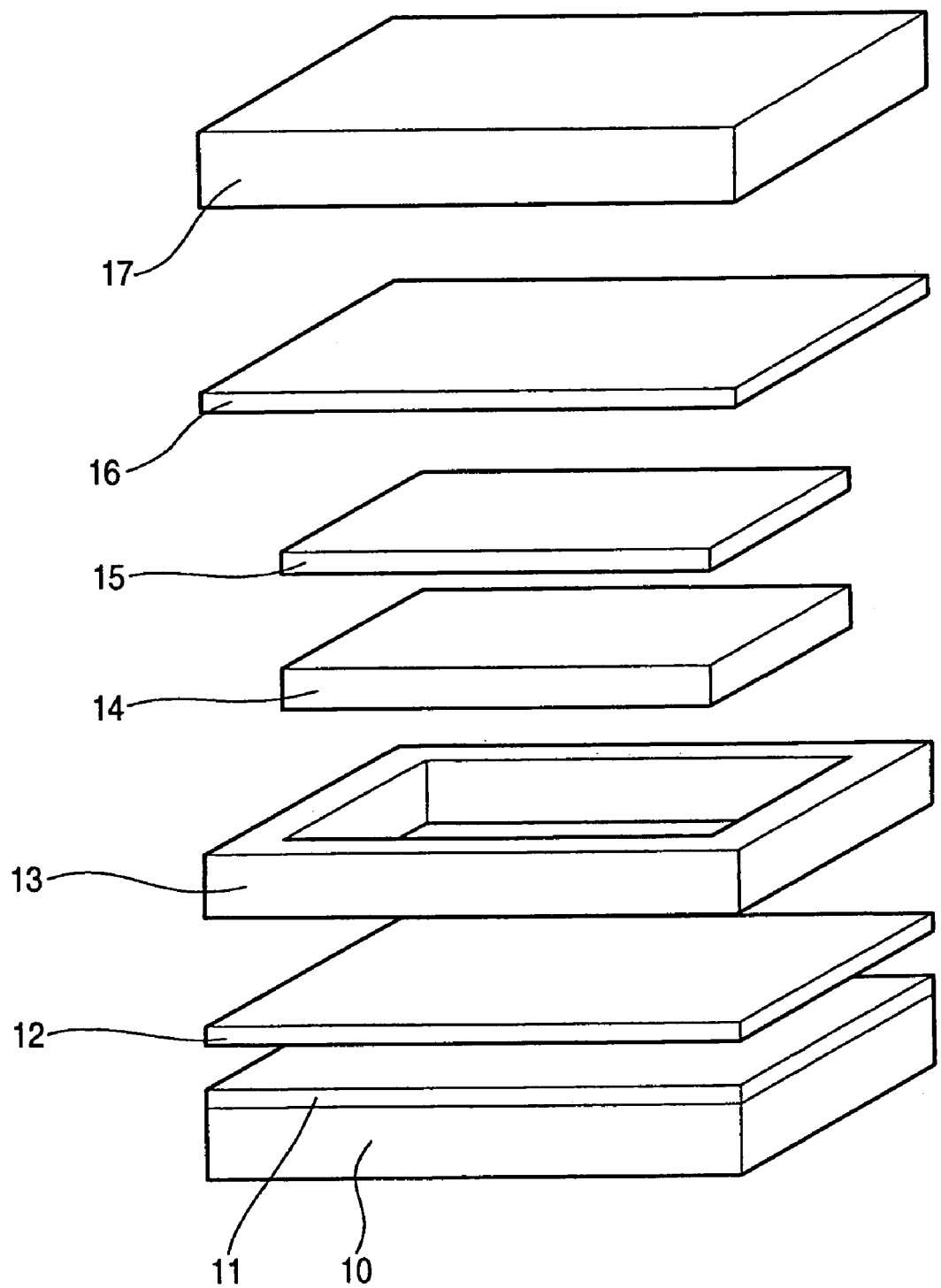
FIG. 2 is an exploded perspective view schematically showing the layer structure of the polar capacitor in accordance with Embodiment 1 of the invention.
Figure 3:
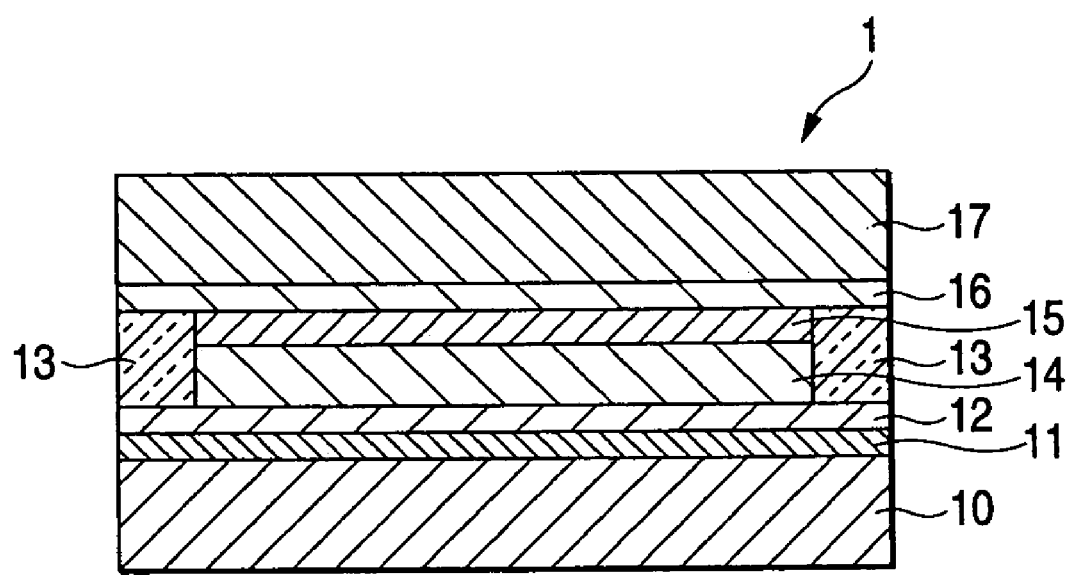
FIG. 3 is a cross sectional view schematically showing the layer structure of the polar capacitor in accordance with Embodiment 1 of the invention.

FIGS. 1, 2, and 3 are an explanatory view showing the outward appearance of a polar capacitor in accordance with Embodiment 1 of the present invention, an exploded perspective view schematically showing the layer structure, and a cross sectional view thereof, respectively.

As shown in FIGS. 1, 2, and 3, in a capacitor 1 of this embodiment, a dielectric layer 11, a manganese dioxide layer 12, an organic solid electrolyte layer 14, and a carbon paste layer 15 are stacked in this order between a first electrode 10 as an anode and a second electrode 16 as a cathode. The second electrode 16 is made of a silver paste. On the upper layer side thereof, an external electrode 17 for a cathode made of a copper foil is stacked. The first electrode 10 is made of a film of a valve metal such as aluminum, tantalum, niobium, tungsten, vanadium, bismuth, titanium, zirconium, hafnium, or an alloy thereof or a compound thereof (e.g., niobium doped with oxygen) In this embodiment, it is formed of aluminum. The dielectric layer 11 is an aluminum oxide film (anodized film) resulting from anodic oxidation of the first electrode 10. The organic solid electrolyte layer 14 is a conductive polymer film of polypyrrole, polyaniline, polythiophene, or the like, formed by electrolytic polymerization.

In this embodiment, between the first electrode 10 and the second electrode 16, an insulating resin layer 13 of a polyimide type, an epoxy type, a silicon type, an acrylic type, or the like is formed in the shape of a rectangular frame in such a manner as to surround the organic solid electrolyte layer 14 on the surface of the manganese dioxide layer 12 of the upper layer side of the dielectric layer 11.

Herein, the height of the resin layer 13 is larger than the thickness dimension of the organic solid electrolyte layer 14. The upper end portion of the resin layer 13 protrudes from the top surface of the organic solid electrolyte layer 14. As a result, the lower end portion of the resin layer 13 is fixed to the manganese dioxide layer 12. Whereas, the upper end portion is fixed to the second electrode 16. Therefore, complete sealing is established between the first electrode 10 and the second electrode 16 in the outer peripheral end face of the capacitor 1.

Therefore, for the capacitor 1 of this embodiment, both of the bottom side interface and the top side interface of the organic solid electrolyte layer 14 are surrounded and covered with the resin layer 13, so that the organic solid electrolyte layer 14 is not exposed at all. Further, the organic solid electrolyte layer 14 is completely sandwiched from above and below, and the space is completely defined by the resin layer 13. Therefore, even when the thermal expansion coefficient of the organic solid electrolyte layer 14 and the thermal expansion coefficient of the layer (the manganese dioxide layer 12 or the second electrode 16) in contact with the organic solid electrolyte layer 14 are different from each other, no peeling will occur at the interface between the organic solid electrolyte layer 14 and the manganese dioxide layer 12 or the interface between the organic solid electrolyte layer 14 and the second electrode 16, upon performing a temperature cycle test, or upon actual use. Further, as distinct from an outer coating resin, the resin layer 13 is not the one for covering the whole, but it is formed only between the first electrode 10 and the second electrode 16. For this reason, even if the resin layer 13 is formed, the outer dimensions of the capacitor 1 do not increase, which does not prevent the decrease in size of the capacitor 1.

(Manufacturing Method)

Figure 4A:
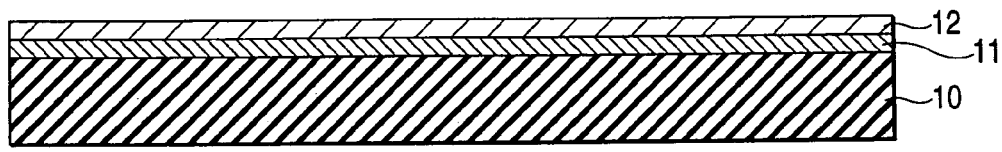
FIGS. 4A to 4D are cross sectional views of the steps showing the manufacturing method of the polar capacitor in accordance with Embodiment 1 of the invention.

For manufacturing the capacitor 1 of such a structure, first, as shown in FIG. 4A, an aluminum foil with a thickness of about 200 μm is prepared as the first electrode 10. Whereas, in this embodiment, a large sized aluminum foil from which a plurality of the capacitors 1 can be cut is prepared as the first electrode 10.

Then, in a dielectric layer forming step, the first electrode 10 (large sized aluminum foil) is anodized in an ammonium adipate aqueous solution to form the dielectric layer 11 with a withstand voltage of 10 V to 80 V on the surface. At this step, the dielectric layer 11 is also formed on the rear face side of the aluminum foil. However, the dielectric layer 11 on the rear face side is not shown.

Then, in an underlying conductive film forming step, manganese nitrate is deposited on the surface of the dielectric layer 11, followed by burning at a temperature of about 200° C., thereby to form a thin manganese dioxide layer 12 with a thickness of 1 μm to 5 μm.

Figure 4B:
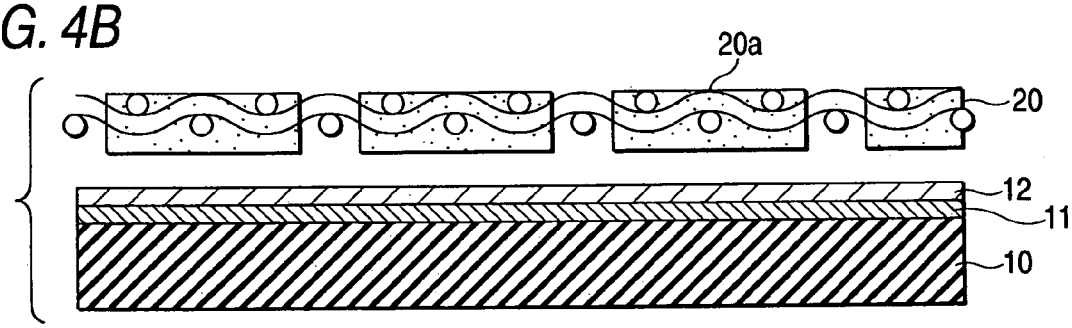
Figure 4C:
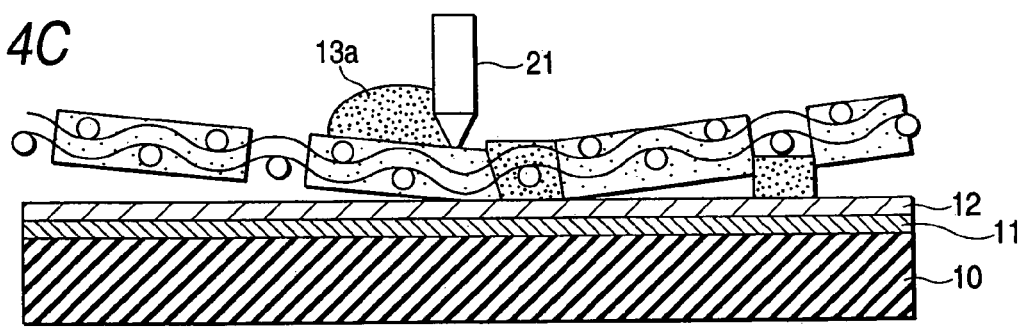

Next, a screen printing method is employed for the purpose of forming the insulating resin layer 13 as will be described from FIG. 4B to FIG. 4D. In FIG. 4B, a screen mask 20 is disposed to be opposed to the thin manganese dioxide layer 12. The screen mask 20 is functioning as a patterning film onto which an emulsion pattern is formed corresponding to a predetermined pattern of a pattern film by exposing the light over the emulsion-coated mask screen with said pattern film on it, and developing the emulsion layer to form the respective emulsion pattern. Then, as shown in FIG. 4C, UV-cure resin 13a is filled into the emulsion pattern by a squeegee 21 so as to print the UV-cure resin pattern onto the insulating resin layer 12.

Figure 4D:
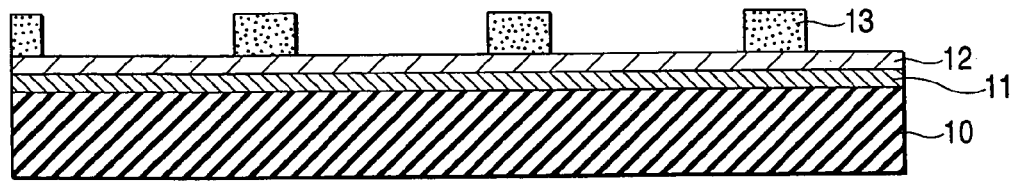

Thus, as shown in FIG. 4D, in a resin layer forming step, the insulating resin layer 13 with a thickness of about 30 μm and a width of 100 μm is formed in the shape of a rectangular frame in such a manner as to surround each formation area of the organic solid electrolyte layer 14 on the surface of the manganese dioxide layer 12. Then, said insulating resin layer 13 is heated and cured by UV-light exposure at a temperature of 150° C. to 200° C. for about 1 hour.

Figure 5A:
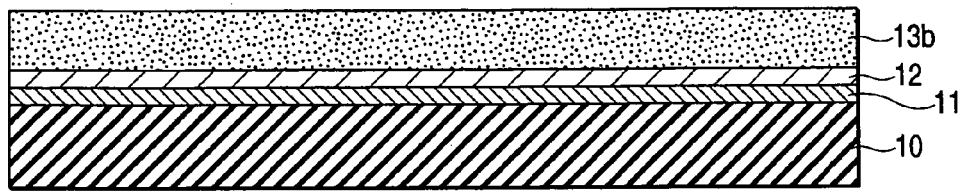
FIGS. 5A to 5D cross sectional views of the steps showing another manufacturing method of the polar capacitor in accordance with Embodiment 1 of the invention.

Alternatively, it is also possible to form the insulating layer 12 by using another method instead of using the screen printing method. That is to say, as shown in FIG. 5A, the resin layer is firstly formed over the insulating layer 12 by the liquid type resist or film resist. Said coating is carried out by the a spin coater or the high-temperature application apparatus (not shown) respectively.

Figure 5B:
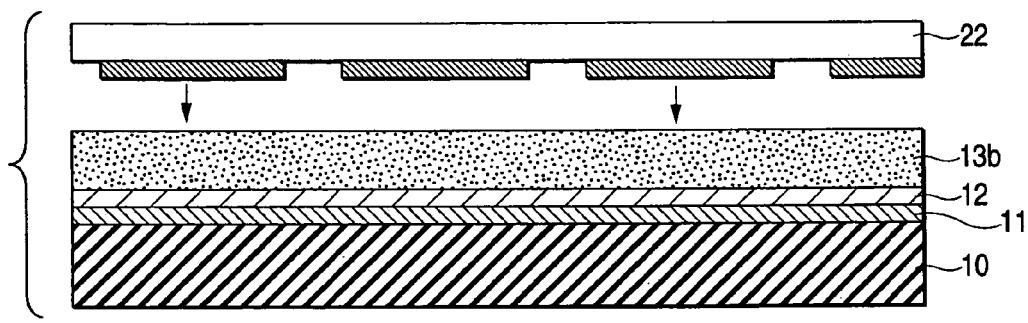
Figure 5C:
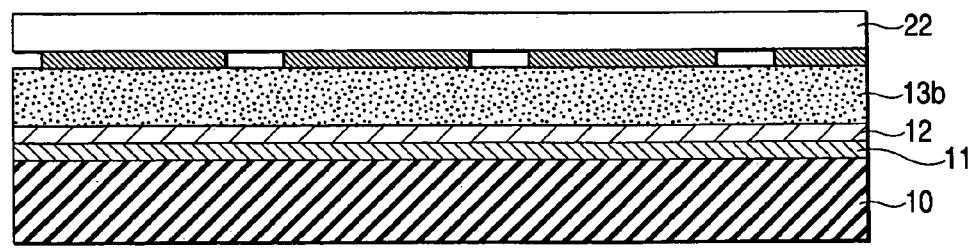
Figure 5D:
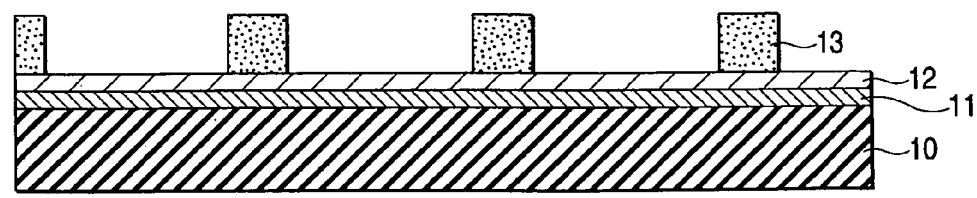

Next, alignment is made between the exposure mask 22 and the resin layer 13b as shown in FIG. 5B, contacting the both, then the exposure is made as shown in FIG. 5C.

Further, a post baking is applied to the patterned resin layer 13b at a temperature of 150° C. to 200° C. for about 1 hour, and the insulating resin layer 13 with a thickness of about 30 μm and a width of 100 μm is formed in the shape of a rectangular frame in such a manner as to surround each formation area of the organic solid electrolyte layer 14 on the surface of the manganese dioxide layer 12.

Figure 6A:
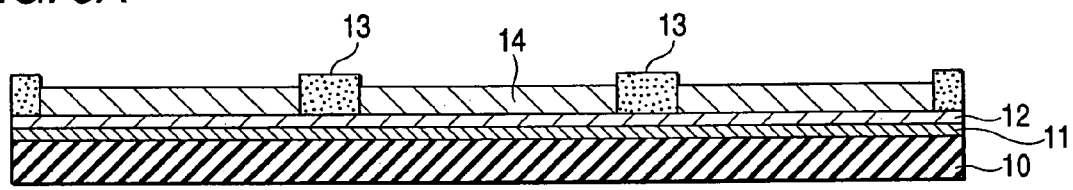
FIGS. 6A to 6C are cross sectional views of the steps showing the manufacturing method of the polar capacitor in accordance with Embodiment 1 of the invention subsequent from FIGS. 4A to 4D or FIGS. 5A to 5D.
Figure 6B:
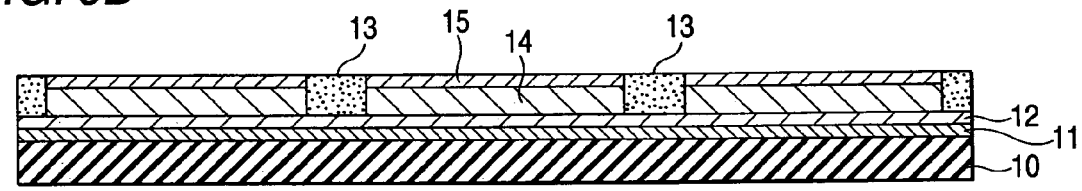
Figure 6C:
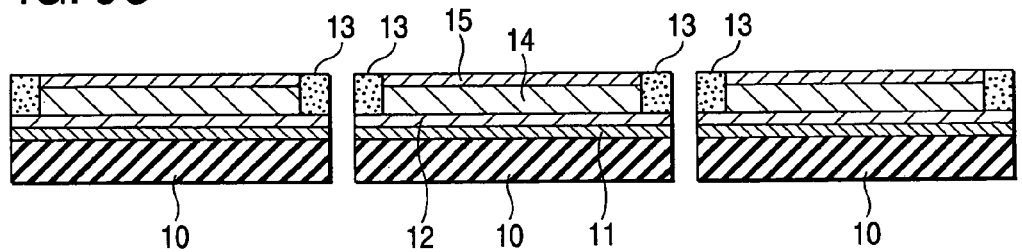

After forming the insulating resin layer 13 as described above, as the subsequent steps will be shown from FIGS. 6A to 6C. In FIG. 6A, in an organic solid electrolyte layer forming step, electrolytic polymerization is carried out on the surface of the dielectric layer 11 imparted with a conductivity by the manganese dioxide layer 12, thereby to form the organic solid electrolyte layer 14 made of a conductive polymer film of polypyrrole or the like, with a thickness of about 20 μm.

Then, as shown in FIG. 6B, the carbon paste layer 15 with a thickness of about 10 μm is formed as the overlying layer of the organic solid electrolyte layer 14 by a dipping method or the like, followed by a heat treatment at a temperature of 150° C. to 180° C.

Then, as shown in FIG. 6C, in a cutting step, the first electrode 10 is cut together with the dielectric layer 11, the manganese dioxide layer 12, and the resin layer 13 along the resin layer 13 by the use of a dicer or the like. As a result, the first electrode 10 is divided together with the respective layers formed as the overlying layers into pieces each of a single product size.

Although the subsequent steps are not shown, as already shown in FIG. 3, a silver paste (second electrode 16) is coated with a thickness of about 20 μm as the overlying layer of the carbon paste layer 15 by a method of printing or the like, and then, a copper foil as the external electrode 17 is stacked thereon.

Then, the dielectric layer 11 and the carbon paste layer 15 formed on the rear side of the first electrode 10 are removed by a method of polishing or the like. Then, an external electrode for an anode is connected to the first electrode 10. As a result, the capacitor 1 is completed.

Thus, with the manufacturing method of this embodiment, after performing the organic solid electrolyte forming step, the large sized first electrode 10 is cut together with the resin layer 13 along the resin layer 13. Therefore, it is possible to prevent the lack of the organic solid electrolyte layer 14 at the cut portion. Therefore, it is possible to prevent the first electrode 10 side and the second electrode 16 side from short-circuiting at the cut end face with reliability.

Further, the resin layer 13 is formed on an upper layer side of the dielectric layer 11. Therefore, it is possible to form the dielectric layer 11 on the first electrode 10 prior to the formation of the resin layer 13. For this reason, when when the dielectric layer 11 is formed, it is not necessary to consider the stability of the resin layer 13 to the chemical to be used, or the heat treatment.

Further, in this embodiment, after the formation of the manganese dioxide layer 12, the resin layer 13 is formed. Therefore, the resin layer 13 is not exposed to a temperature of 200° C. for forming the manganese dioxide layer 12. Therefore, the resin layer 13 is not required to have an excessive heat resistance, and hence various resins can be adopted for the resin layer 13.

Embodiment 2

FIG. 7 and FIGS. 8A to 8F are a cross sectional view of a polar capacitor 1A in accordance with Embodiment 2 of the invention, and the cross sectional views of the steps, respectively. Incidentally, the capacitor 1A and the manufacturing method of this embodiment are equal in basic configuration to Embodiment 1. Therefore, the portions having the common functions are given the same reference numerals and signs, and a detailed description thereon will be omitted.

Figure 7:
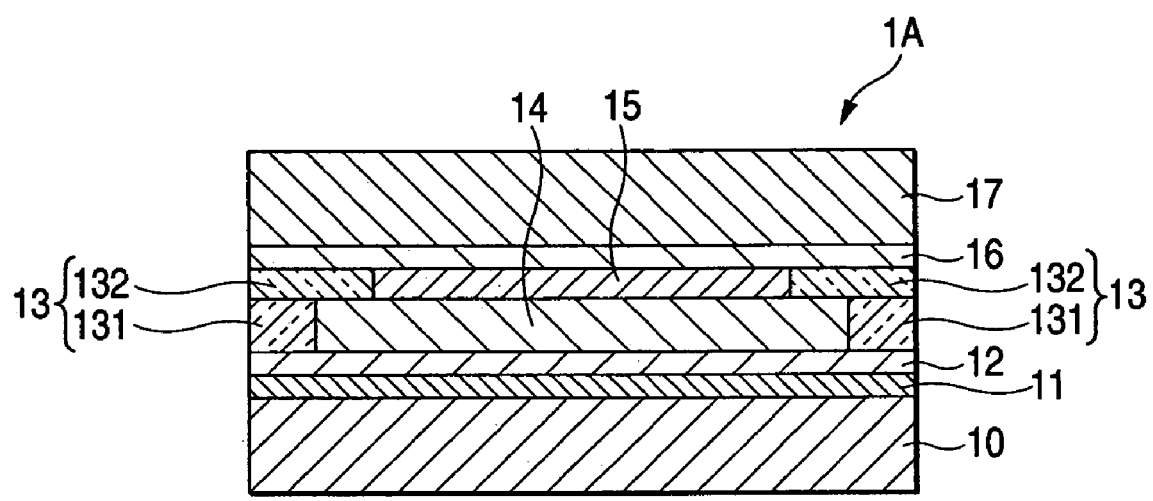
FIG. 7 is a cross sectional view schematically showing the layer structure of a polar capacitor in accordance with Embodiment 2 of the invention.

As shown in FIG. 7, in the capacitor 1 of this embodiment, a dielectric layer 11, a manganese dioxide layer 12, an organic solid electrolyte layer 14 made of a conductive polymer film of polypyrrole, polyaniline, polythiophene, or the like, and a carbon paste layer 15 are stacked in this order between a first electrode 10 as an anode and a second electrode 16 as a cathode. The second electrode 16 is made of a silver paste. On the upper layer side thereof, an external electrode 17 made of a copper foil is stacked.

Also in this embodiment, as with Embodiment 1, a resin layer 13 is formed in the shape of a rectangular frame in such a manner as to surround the organic solid electrolyte layer 14 on the surface of the manganese dioxide layer 12 of the upper layer side of the dielectric layer 11 between the first electrode 10 and the second electrode 16.

Herein, the resin layer 13 is formed in a dual-stage structure of an insulating lower layer side resin layer 131 of a polyimide type, an epoxy type, a silicon type, an acrylic type, or the like, and an insulating upper layer side resin layer 132 of, similarly, a polyimide type, an epoxy type, a silicon type, an acrylic type, or the like. The height of the lower layer side resin layer 131 is roughly equal to the thickness dimension of the organic solid electrolyte layer 14. The top portion of the lower layer side resin layer 131 is situated in a position at a roughly equal height to the top surface of the organic solid electrolyte layer 14. The upper layer side resin layer 132 is larger in width than the lower layer side resin layer 131, and hence partially covers the tope surface of the organic solid electrolyte layer 14.

Thus, in this embodiment, for the resin layer 13, the lower end portion of the lower layer side resin layer 131 is fixed to the manganese dioxide layer 12. Whereas, the upper end portion of the upper layer side resin layer 132 is fixed to the second electrode 16. Thus, complete sealing is established between the first electrode 10 and the second electrode 16 in the outer peripheral end face of the capacitor 1.

Therefore, for the capacitor 1A of this embodiment, both of the bottom side interface and the top side interface of the organic solid electrolyte layer 14 are surrounded and covered with the resin layer 13, so that the organic solid electrolyte layer 14 is not exposed at all. Therefore, peeling of the organic solid electrolyte layer 14 caused by a temperature change or the like does not occur at all. Thus, the same effects as with Embodiment 1 including this effect are produced.

Further, the upper layer side resin layer 132 partially covers the top surface of the organic solid electrolyte layer 14. Therefore, it is possible to prevent the peeling at the interface of the organic solid electrolyte layer 14 with more reliability.

Figure 8A:
FIGS. 8A to 8F are cross sectional views of the steps showing the manufacturing method of the polar capacitor in accordance with Embodiment 2 of the invention.

For manufacturing the capacitor 1A of this embodiment, first, as shown in FIG. 8A, a large sized aluminum foil from which a plurality of the capacitors 1A can be cut is prepared as the first electrode 10. Then, in a dielectric layer forming step, the dielectric layer 11 is formed on the surface of the first electrode 10 (large sized aluminum foil) by anodic oxidation. Then, in an underlying conductive film forming step, manganese nitrate is deposited on the surface of the dielectric layer 11, followed by burning at a temperature of about 200° C., thereby to form a thin manganese dioxide layer 12 with a thickness of 1 μm to 5 μm.

Figure 8B:
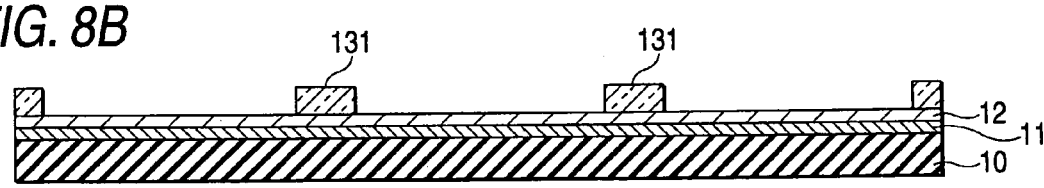

Then, as shown in FIG. 8B, in a lower layer side resin layer forming step, the insulating lower layer side resin layer 131 with a thickness of about 20 μm and a width of 100 μm is formed in the shape of a rectangular frame in such a manner as to surround each formation area of the organic solid electrolyte layer 14 on the surface of the manganese dioxide layer 12 by a method of printing, transfer, or the like. Then, it is heated and cured at a temperature of 150° C. to 200° C. for about 1 hour.

Figure 8C:
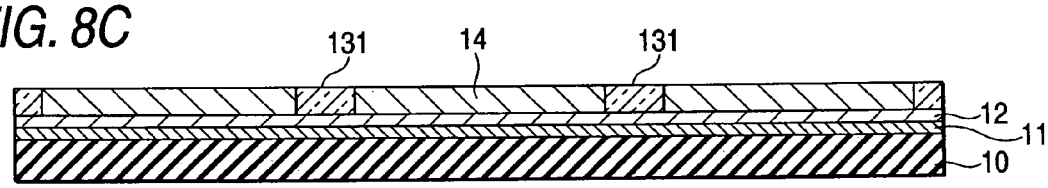

Then, as shown in FIG. 8C, in an organic solid electrolyte layer forming step, electrolytic polymerization is carried out on the surface of the dielectric layer 11 imparted with a conductivity by the manganese dioxide layer 12, thereby to form the organic solid electrolyte layer 14 made of a conductive polymer film of polypyrrole or the like, with a thickness of about 20 μm.

Figure 8D:
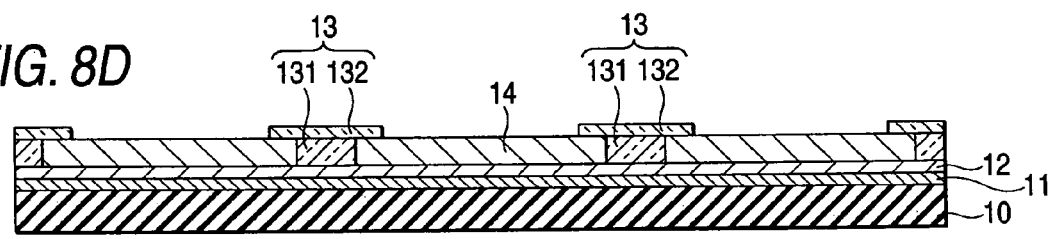
Figure 8E:
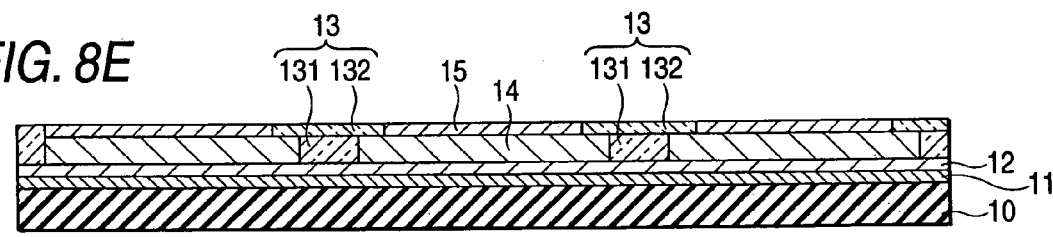

Then, as shown in FIG. 8D, in a step of forming the upper layer side resin layer 132, the insulating upper layer side resin layer 132 with a thickness of about 20 μm and a width of 200 μm is formed in the shape of a rectangular frame on the surface of the lower layer side resin layer 131 by a method of printing, transfer, or the like. Then, it is heated and cured at a temperature of 150° C. to 200° C. for about 1 hour.

Then, as shown in FIG. 68E, the carbon paste layer 15 with a thickness of about 10 to 20 μm is formed as the overlying layer of the organic solid electrolyte layer 14 by a dipping method, followed by a heat treatment at a temperature of 150° C. to 180° C.

Figure 8F:
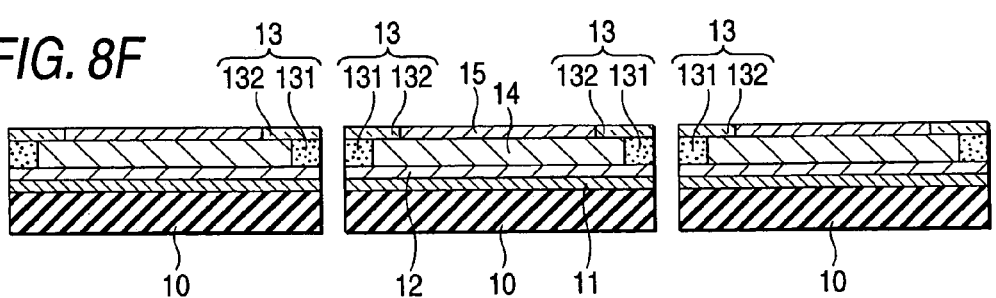

Then, as shown in FIG. 8F, in a cutting step, the first electrode layer 10 is cut together with the dielectric layer 11, the manganese dioxide layer 12, and the resin layer 13 along the resin layer 13 by the use of a dicer or the like. As a result, the first electrode 10 is divided together with the respective layers formed as the overlying layers into pieces each of a single product size. The subsequent steps are the same as those in Embodiment 1, and hence a description thereon will be omitted.

Thus, also with this embodiment, after performing the organic solid electrolyte layer forming step, the large sized first electrode 10 is cut together with the resin layer 13 along the resin layer 13. Therefore, it is possible to prevent the lack of the organic solid electrolyte layer 14 at the cut portion. Therefore, it is possible to prevent the first electrode 10 side and the second electrode 16 side from short-circuiting at the cut end face with reliability. Thus, the same effects as with Embodiment 1 including this effect are produced.

Embodiment 3

FIG. 9 and FIGS. 10A to 10F are a cross sectional view of a polar capacitor 1B in accordance with Embodiment 3 of the invention, and the cross sectional views of the steps, respectively. Incidentally, the capacitor 1B and the manufacturing method of this embodiment are equal in basic configuration to Embodiment 1. Therefore, the portions having the common functions are given the same reference numerals and signs, and a detailed description thereon will be omitted.

Figure 9:
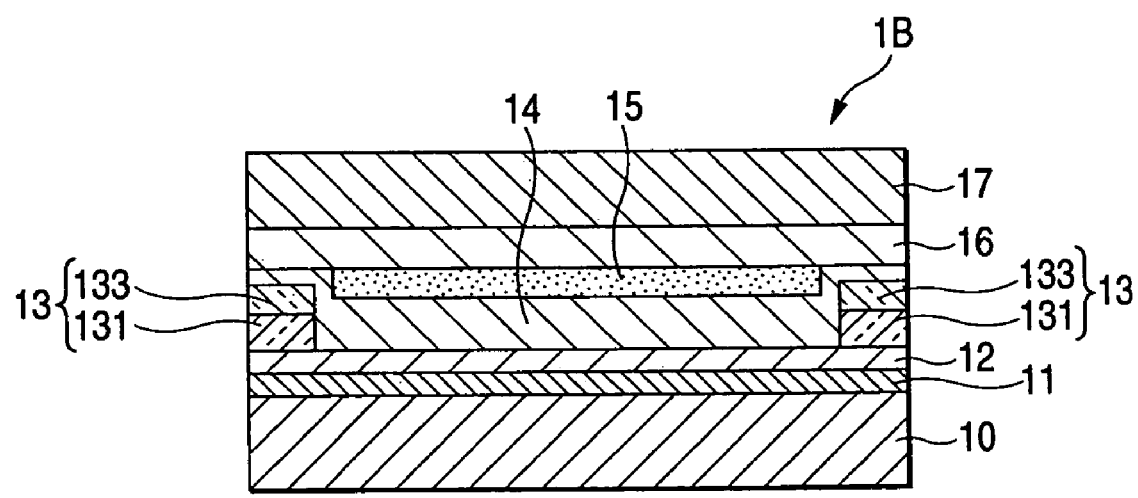
FIG. 9 is a cross sectional view schematically showing the layer structure of a polar capacitor in accordance with Embodiment 3 of the invention.

As shown in FIG. 9, in the capacitor 1B of this embodiment, a dielectric layer 11, a manganese dioxide layer 12, an organic solid electrolyte layer 14 made of a conductive polymer film of polypyrrole, polyaniline, polythiophene, or the like, and a carbon paste layer 15 are stacked in this order between a first electrode 10 as an anode and a second electrode 16 as a cathode. The second electrode 16 is made of a silver paste. On the upper layer side thereof, an external electrode 17 made of a copper foil is stacked.

In this embodiment, a resin layer 13 is formed in the shape of a rectangular frame in such a manner as to surround the organic solid electrolyte layer 14 on the surface of the manganese dioxide layer 12 of the upper layer side of the dielectric layer 11 between the first electrode 10 and the second electrode 16.

Also in this embodiment, as with Embodiment 1, a resin layer 13 is formed in the shape of a rectangular frame in such a manner as to surround the organic solid electrolyte layer 14 on the surface of the manganese dioxide layer 12 of the upper layer side of the dielectric layer 11 between the first electrode 10 and the second electrode 16.

Herein, the resin layer 13 is formed in a dual-stage structure of an insulating lower layer side, which is resin layer 131 made of polyimide type, epoxy type, silicon type, acrylic type, or the like, and a conductive upper layer side, which is a resin layer 133 obtained by adding conductive particles or a conductive organic compound in the same resin matrix as the lower layer side resin layer 131. As to the height of the lower layer side resin layer 131, it is lower than the thickness dimension of the organic solid electrolyte layer 14. On the other hand, height of the top portion side resin layer 133 is higher than that of the organic solid electrolyte layer 14. The upper layer side resin layer 133 is equal in width to, or smaller in width than the lower layer side resin layer 131.

Thus, in this embodiment, for the resin layer 13, the lower end portion of the lower layer side resin layer 131 is fixed to the manganese dioxide layer 12. Whereas, the upper end portion of the upper layer side resin layer 133 is fixed to the second electrode 16. Thus, complete sealing is established between the first electrode 10 and the second electrode 16 in the outer peripheral end face of the capacitor 1.

Therefore, for the capacitor 1B of this embodiment, both of the bottom side interface and the top side interface of the organic solid electrolyte layer 14 are surrounded and covered with the resin layer 13, so that the organic solid electrolyte layer 14 is not exposed at all. Therefore, peeling of the organic solid electrolyte layer 14 caused by a temperature change or the like does not occur at all. Thus, the same effects as with Embodiment 1 including this effect are produced.

Further, this embodiment has the following advantage. The upper layer side resin layer 133 is made of a conductive resin. Therefore, when the following manufacturing method is adopted, the adhesion between the upper layer side resin layer 133 and the organic solid electrolyte layer 14 can be improved.

Figure 10A:
FIGS. 10A to 10G are cross sectional views of the steps showing the manufacturing method of the polar capacitor in accordance with Embodiment 3 of the invention.

For manufacturing the capacitor B1 of this embodiment, first, as shown in FIG. 10A, a large sized aluminum foil from which a plurality of the capacitors 1 can be cut is prepared as the first electrode 10. Then, in a dielectric layer forming step, the dielectric layer 11 is formed on the surface of the first electrode 10 (large sized aluminum foil) by anodic oxidation. Then, in an underlying conductive film forming step, manganese nitrate is deposited on the surface of the dielectric layer 11, followed by burning at a temperature of about 200° C., thereby to form a thin manganese dioxide layer 12 with a thickness of 1 μm to 5 μm.

Figure 10B:
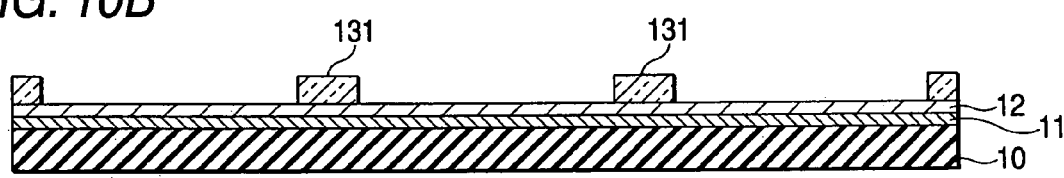

Then, as shown in FIG. 10B, in a lower layer side resin layer forming step, the insulating lower layer side resin layer 131 with a thickness of about 20 μm and a width of 100 μm is formed in the shape of a rectangular frame in such a manner as to surround each formation area of the organic solid electrolyte layer 14 on the surface of the manganese dioxide layer 12 by a method of printing, transfer, or the like. Then, it is heated and cured at a temperature of 150° C. to 200° C. for about 1 hour.

Figure 10C:
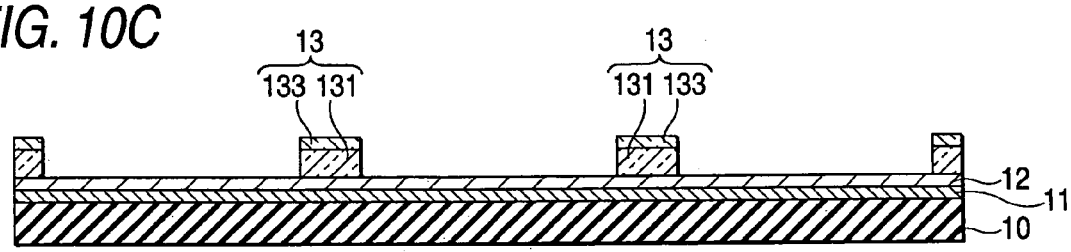
Figure 10D:
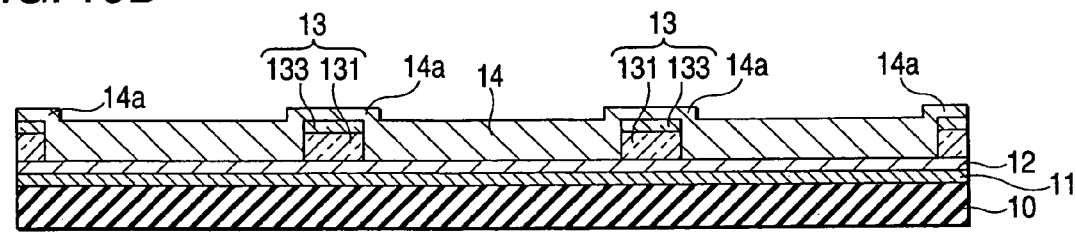

Then, as shown in FIG. 10C, in an upper layer side resin layer forming step, the conductive upper layer side resin layer 133 with a thickness of about 20 μm and a width of 80 μm to 100 μm is formed in the shape of a rectangular frame on the surface of the lower layer side resin layer 131 by a method of printing, transfer, or the like. Then, it is heated and cured at a temperature of 150° C. to 200° C. for about 1 hour.

Next, as shown in FIG. 10, in an organic solid electrolyte layer forming step, electrolytic polymerization is carried out over the surfaces of the conductive upper layer side resin layer 133, including the side surface thereof, the side surface of the lower layer side resin layer 131, and the dielectric layer 11 imparted with a conductivity by the manganese dioxide layer 12, thereby to form the organic solid electrolyte layer 14 made of a conductive polymer film of polypyrrole or the like, with a thickness of about 30 μm.

Figure 10E:
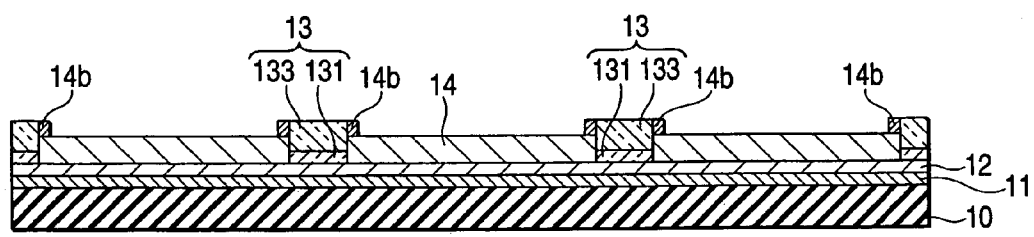

However, in the polishing step as shown in FIG. 10E, polishing is carried out to the cap portion of the organic solid electrolyte layer 14, which is covering the conductive upper layer side resin layer 133 and the side surface thereof, in a way such that the top surface of the conductive upper layer side resin layer is exposed with leaving the side wall 14b of the cap portion.

Figure 10F:
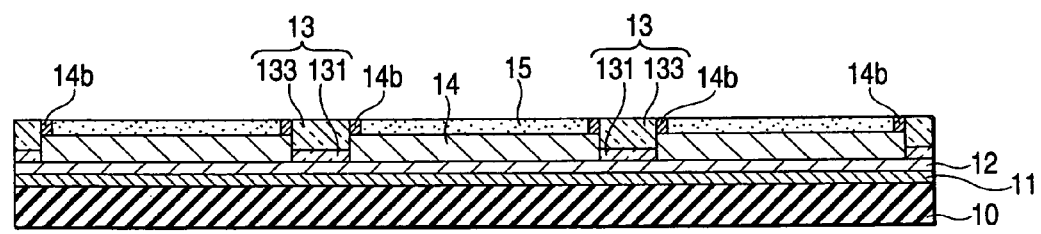

Then, as shown in FIG. 10F, the carbon paste layer 15 with a thickness of about 10 to 20 μm is partly formed on the organic solid electrolyte layer 14 where the dielectric layer 11 is stacking beneath thereof, by a dipping method followed by a heat treatment at a temperature of 150° C. to 180° C.

Figure 10G:
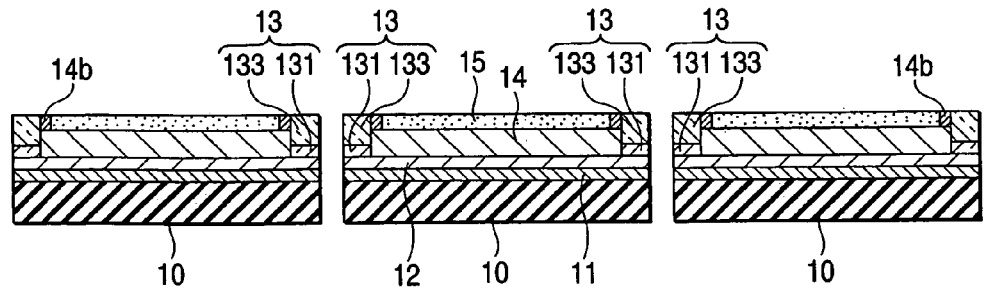

Then, as shown in FIG. 10G, in a cutting step, the first electrode 10 is cut together with the dielectric layer 11, the manganese dioxide layer 12, and the resin layer 13 along the resin layer 13 by the use of a dicer or the like. As a result, the first electrode 10 is divided together with the respective layers formed as the overlying layers into pieces each of a single product size. The subsequent steps are the same as those in Embodiment 1, and hence a description thereon will be omitted.

Thus, also in this embodiment, after performing the organic solid electrolyte layer forming step, the large sized first electrode 10 is cut together with the resin layer 13 along the resin layer 13. Therefore, it is possible to prevent the lack of the organic solid electrolyte layer 14 at the cut portion. Therefore, it is possible to prevent the first electrode 10 side and the second electrode 16 side from short-circuiting at the cut end face with reliability. Thus, the same effects as with Embodiment 1 including this effect are produced.

Whereas, in this embodiment, in the upper layer side resin layer forming step, the conductive upper layer side resin layer 133 is formed on the surface of the lower layer side resin layer 131. Then, in the organic solid electrolyte layer forming step, the organic solid electrolyte layer 14 made of a conductive polymer film is formed by electrolytic polymerization. For this reason, the organic solid electrolyte layer 14 made of a conductive polymer film is also formed at a part of the upper layer side resin layer 133 from halfway during the electrolytic polymerization. Therefore, the adhesion between the upper layer side resin layer 133 and the organic solid electrolyte layer 14 is advantageously high.

Embodiment 4

Figure 11:
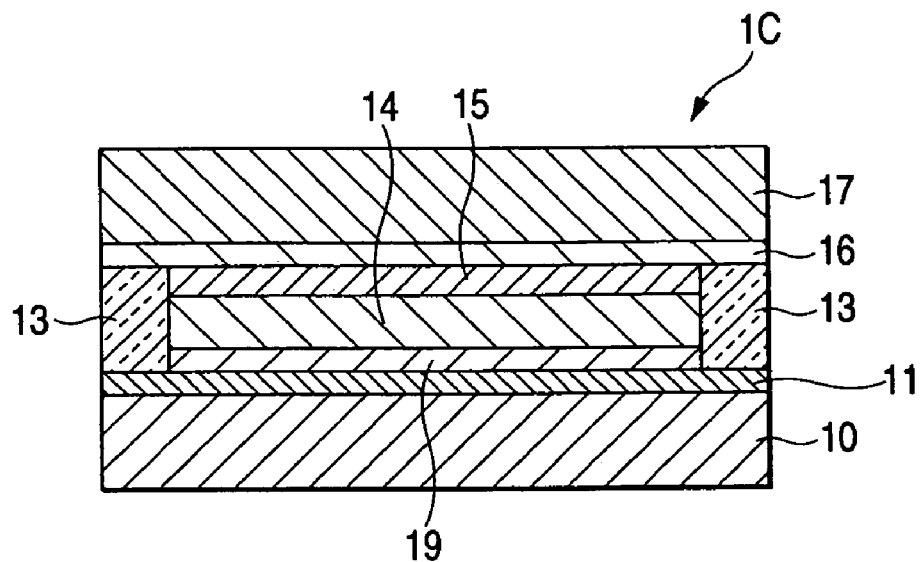
FIG. 11 is a cross sectional view schematically showing the layer structure of a polar capacitor in accordance with Embodiment 5 of the invention.

FIG. 11 is a cross sectional view of a polar capacitor 1C in accordance with Embodiment 4 of the invention, and a cross sectional view of the step thereof.

In Embodiments 1, 2, and 3 above, the surface of the dielectric layer 11 was imparted with a conductivity by the manganese dioxide layer 12. However, as shown in FIG. 11, a conductive chemically polymerized film 19 may be formed on the surface of the dielectric film 11. In this case, a solution or a vapor containing a monomer or an oligomer, and further a dopant is brought in contact with the dielectric layer 11. Alternatively, a chemically polymerized film 19 is deposited on the surface of the dielectric layer 11 in a solution containing a monomer or an oligomer of polypyrrole, polyaniline, polythiophene, or the like, and further a dopant with the addition of an oxidant. However, in this case, the resin layer 13 is formed on the surface of the dielectric layer 11 so as to prevent the peeling at the interface between the chemically polymerized film 19 and the dielectric layer 11 from occurring.

Embodiment 5

Figure 12:
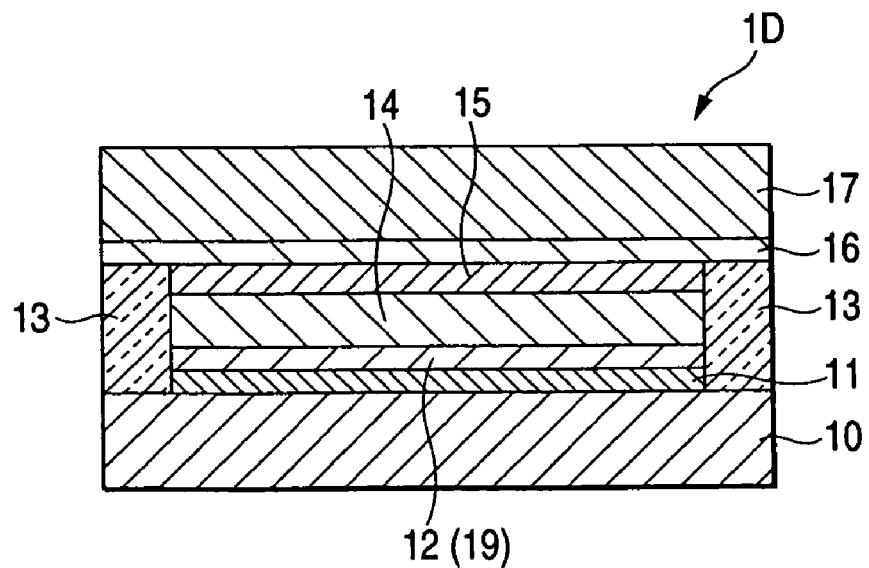
FIG. 12 is a cross sectional view schematically showing the layer structure of a polar capacitor in accordance with Embodiment 4 of the invention.

FIG. 12 is a cross sectional view of a polar capacitor 1D in accordance with Embodiment 5 of the invention, and a cross sectional view of the step thereof.

In Embodiments 1, 2, and 3 above, the resin layer 13 was formed on the surface of the manganese dioxide layer 12. In Embodiment 4, the resin layer was formed on the surface of the dielectric layer 11. However, as shown in FIG. 12, the resin layer 13 may be formed on the surface of the first electrode 10.

Other Embodiments

In the foregoing embodiments, as the organic solid electrolyte layer 14, the conductive polymer such as polypyrrole, polyaniline, or polythiophene was used. However, a TCNQ complex may also be used. For the TCNQ complex, the solid electrolyte layer may be formed by, for example, performing heating and melting with the TCNQ complex arranged on a prescribed area, followed by cooling and solidification.

[Application Example to Capacitor-Embedded Board]

Figure 13:
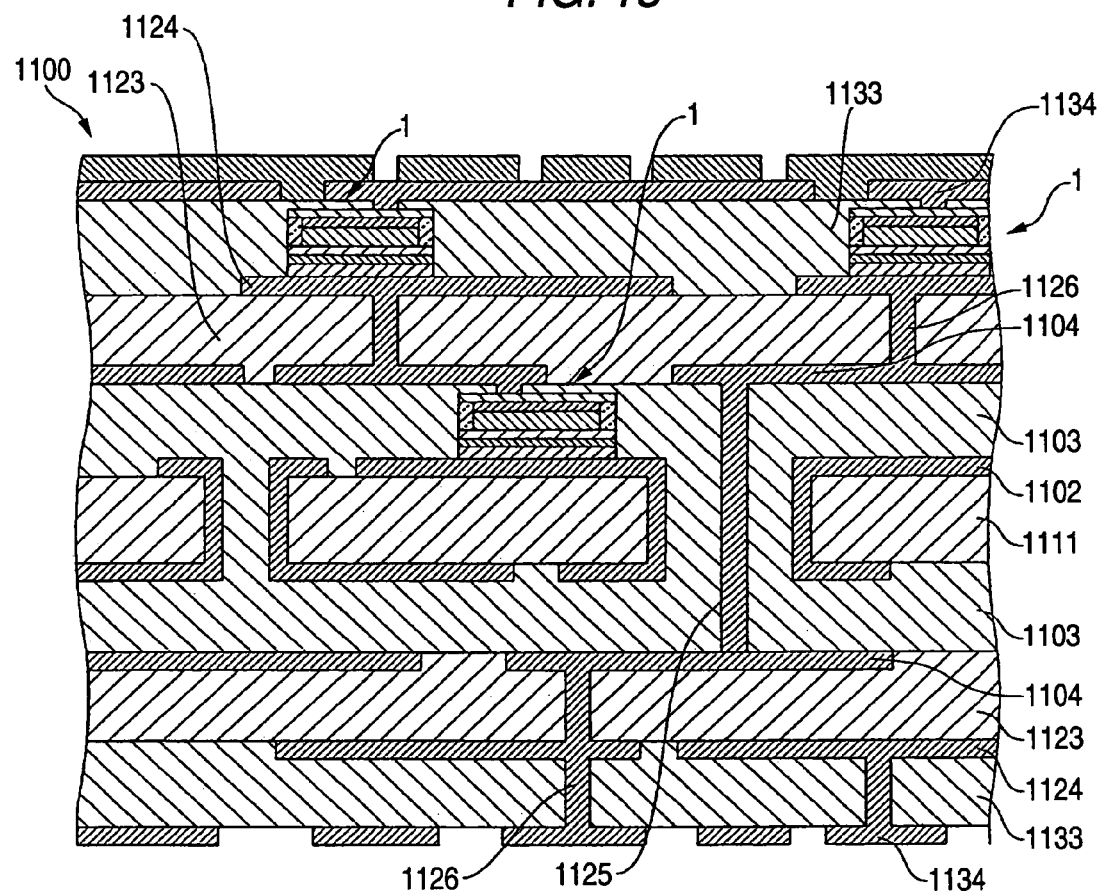
FIG. 13 is a cross sectional view of a capacitor-embedded board including a capacitor to which the invention has been applied.

FIG. 13 is a cross sectional view of a capacitor-embedded board including a capacitor embedded in a wiring board to which the invention has been applied. In FIG. 13, a capacitor-embedded board 1100 of this embodiment is a circuit board having a so-called built-up structure. In the capacitor-embedded board 1100, on the top surface and the bottom surface of a core substrate 1111 made of a silicon substrate, a ceramic substrate, a resin substrate, or a glass-epoxy substrate, a plurality of wiring layers 1102, 1104, 1124, and 1134 made of copper layers are formed. These wiring layers are isolated from one another via insulating films 1103, 1123, and 1133. In this embodiment, on the surface of a portion of the wiring layers 1102 and 1124, a first electrode 10 (see, e.g., FIG. 1) of the capacitor 1, made of aluminum or tantalum, is formed by a sputtering method or the like.

The capacitor-embedded board 1100 herein shown has a total of 3 capacitors 1 on the top surface side of the core substrate 1111. All of these capacitors 1 have, for example, the same structure as with Embodiment 1. Namely, in any of the three capacitors 1, as shown in FIGS. 3, 7, 9, 11, and 12, the first electrode 10 as an anode, the dielectric layer 11, the manganese dioxide layer 12 or the chemically polymerized film 19, the organic solid electrolyte layer 14 made of a conductive polymer film, the carbon paste layer 15, and the second electrode 16 as a cathode are stacked in this order. In addition, the organic solid electrolyte layer 14 is surrounded by the resin layer 13. Whereas, the capacitors 1 and the wiring layers 1102, 1104, 1124, and 1134 are mutually connected via a conductive metal filled in through holes 1125 and via holes 1126 formed by a method of laser processing or the like in the core substrate 1111 and the insulating films 1103, 1123, and 1133.

INDUSTRIAL AVAILABILITY

In the present invention, the upper end portion and the lower end portion of the resin layer formed in such a manner as to surround the organic solid electrolyte layer are fixed to the layers other than the organic solid electrolyte layer on the first electrode side and on the second electrode side, respectively. Therefore, both of the bottom side interface and the top side interface of the organic solid electrolyte layer are surrounded and covered with the resin layer, so that the organic solid electrolyte layer is not exposed at all. As a result, the organic solid electrolyte layer will not peel off due to a temperature change or the like. Further, the resin layer is formed between the first electrode and the second electrode.

For this reason, even if the resin layer is formed, the outer dimensions of the capacitor do not increase, which does not prevent the decrease in size of the capacitor. As a result, it is possible to provide a small sized and high reliability capacitor.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A capacitor comprising a first electrode and a second electrode, and at least a dielectric layer and an organic solid electrolyte stacked in this order between the first electrode and the second electrode,
   the capacitor comprising a resin layer formed in such a manner as to surround the organic solid electrolyte layer between the first electrode and the second electrode,
   wherein an upper end portion and a lower end portion of the resin layer are fixed to layers other than the organic solid electrolyte layer on the first electrode side and the second electrode side, respectively.

2. The capacitor according to claim 1, wherein the resin layer is formed on an upper layer side of the dielectric layer.

3. The capacitor according to claim 2, wherein the resin layer includes a lower layer side resin layer on the first electrode side and an upper layer side resin layer stacked on the lower layer side resin layer, and
   both the lower layer side resin layer and the upper layer side resin layer are composed of an insulating resin.

4. The capacitor according to claim 3, wherein the upper layer side resin layer has a first width dimension and the lower layer side resin layer has a second width dimension, and wherein the first width dimension is larger than the second width dimension, and wherein said upper layer side resin layer partially covers a top surface of the solid electrolyte layer.

5. The capacitor according to claim 2, wherein the resin layer includes a lower layer side resin layer on the first electrode side and an upper layer side resin layer stacked on the lower layer side resin layer, and
the lower layer side resin layer is composed of an insulating resin, and the upper layer side resin layer is composed of a conductive resin.

6. The capacitor according to claim 5, wherein the upper layer side resin layer has a first width dimension and the lower layer side resin layer has a second width dimension, and wherein the first width dimension is larger than the second width dimension, and wherein said upper layer side resin layer partially covers a top surface of the solid electrolyte layer.

7. The capacitor according to claim 1, wherein the resin layer includes a lower layer side resin layer on the first electrode side and an upper layer side resin layer stacked on the lower layer side resin layer, and
both the lower layer side resin layer and the upper layer side resin layer are composed of an insulating resin.

8. The capacitor according to claim 7, wherein the upper layer side resin layer has a first width dimension and the lower layer side resin layer has a second width dimension, and wherein the first width dimension is larger than the second width dimension, and wherein said upper layer side resin layer partially covers a top surface of the solid electrolyte layer.

9. The capacitor according to claim 1, wherein the resin layer includes a lower layer side resin layer on the first electrode side and an upper layer side resin layer stacked on the lower layer side resin layer, and
the lower layer side resin layer is composed of an insulating resin, and the upper layer side resin layer is composed of a conductive resin.

10. The capacitor according to claim 9, wherein the upper layer side resin layer has a first width dimension and the lower layer side resin layer has a second width dimension, and wherein the first width dimension is larger than the second width dimension, and wherein said upper layer side resin layer partially covers a top surface of the solid electrolyte layer.

11. A capacitor-embedded board including the capacitor according to claim 1, comprising an insulating substrate for forming a board for capacitor incorporation, the first electrode being formed on the insulating substrate.

12. A method for manufacturing a capacitor in which at least a dielectric layer, an organic solid electrolyte, and a second electrode are stacked in this order on a first electrode, comprising the steps of:
a resin layer formation step of forming a resin layer in such a manner as to surround an organic solid electrolyte layer formation area on the first electrode side prior to the formation of the organic solid electrolyte layer;
an organic solid electrolyte layer formation step of forming the organic solid electrolyte layer in an area surrounded by the resin layer; and
a second electrode formation step of forming the second electrode on the upper layer side of the organic solid electrolyte layer.

13. The method for manufacturing a capacitor according to claim 12, comprising the further steps of:
preparing a large sized first electrode capable of manufacturing a plurality of capacitors,
in the resin layer formation step, forming the resin layer so as to surround a plurality of the organic solid electrolyte layer formation areas on the large sized first electrode side;
in the organic solid electrolyte layer formation step, forming the organic solid electrolyte layer in a plurality of areas surrounded by the resin layer, and
after performing the organic solid electrolyte layer formation step, cutting the large sized first electrode together with the resin layer along the resin layer.

* * * * *